US012648080B2

(12) United States Patent
Sakai et al.

(10) Patent No.: US 12,648,080 B2
(45) Date of Patent: Jun. 2, 2026

(54) PRINTED WIRING BOARD

(71) Applicant: IBIDEN CO., LTD., Ogaki (JP)

(72) Inventors: Jun Sakai, Ogaki (JP); Takuya Inishi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 223 days.

(21) Appl. No.: 18/537,920

(22) Filed: Dec. 13, 2023

(65) Prior Publication Data

US 2024/0206064 A1 Jun. 20, 2024

(30) Foreign Application Priority Data

Dec. 14, 2022 (JP) .................................. 2022-199803

(51) Int. Cl.
*H05K 1/11* (2006.01)
*H05K 1/185* (2026.01)
*H05K 3/42* (2006.01)

(52) U.S. Cl.
CPC ............. *H05K 1/115* (2013.01); *H05K 1/188* (2013.01); *H05K 3/423* (2013.01); *H05K 2201/10015* (2013.01)

(58) Field of Classification Search
None
See application file for complete search history.

(56) References Cited

U.S. PATENT DOCUMENTS

2018/0166372 A1 * 6/2018 Shimizu ............... H05K 3/4644
2021/0045242 A1 * 2/2021 Tanaka ................. H05K 3/4682
2022/0071016 A1 * 3/2022 Hwang .................. H05K 3/427

FOREIGN PATENT DOCUMENTS

JP 2014-038890 A 2/2014

* cited by examiner

*Primary Examiner* — Timothy J Thompson
*Assistant Examiner* — John B Freal
(74) *Attorney, Agent, or Firm* — Finnegan, Henderson, Farabow, Garrett & Dunner, LLP

(57) ABSTRACT

A printed wiring board includes a base substrate, an electronic component accommodated in a cavity formed in the substrate, a resin insulating layer formed on the substrate such that the insulating layer is covering the electronic component, a conductor layer formed on the insulating layer, and via conductors formed in the insulating layer and each including a seed layer and an electrolytic plating layer formed on the seed layer such that the via conductors are connecting the conductor layer and electrodes of the electronic component. The insulating layer includes resin and inorganic particles and has via holes in which the via conductors is formed respectively such the inorganic particles include first inorganic particles having smooth surfaces and second inorganic particles embedded in the insulating layer and that an inner wall surface of each of the via holes includes the resin and the smooth surfaces of the first inorganic particles.

20 Claims, 12 Drawing Sheets

PRINTED WIRING BOARD

CROSS-REFERENCE TO RELATED APPLICATIONS

The present application is based upon and claims the benefit of priority to Japanese Patent Application No. 2022-199803, filed Dec. 14, 2022, the entire contents of which are incorporated herein by reference.

BACKGROUND OF THE INVENTION

Field of the Invention

The present invention relates to a printed wiring board.

Description of Background Art

Japanese Patent Application Laid-Open Publication No. 2014-38890 describes a wiring board having a base substrate in which a cavity is formed, and an electronic component accommodated in the cavity of the base substrate. The entire contents of this publication are incorporated herein by reference.

SUMMARY OF THE INVENTION

According to one aspect of the present invention, a printed wiring board includes a base substrate, an electronic component accommodated in a cavity formed in the base substrate, a resin insulating layer formed on the base substrate such that the resin insulating layer is covering the electronic component, a conductor layer formed on the resin insulating layer, and via conductors formed in the resin insulating layer and each including a seed layer and an electrolytic plating layer formed on the seed layer such that the via conductors are connecting the conductor layer and electrodes of the electronic component. The resin insulating layer includes resin and inorganic particles and has via holes in which the via conductors is formed respectively such the inorganic particles include first inorganic particles having smooth surfaces and second inorganic particles embedded in the resin insulating layer and that an inner wall surface of each of the via holes includes the resin and the smooth surfaces of the first inorganic particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view schematically illustrating a printed wiring board according to an embodiment of the present invention;

FIG. 3B is a cross-sectional view schematically illustrating a method for manufacturing a printed wiring board according to an embodiment of the present invention;

FIG. 3C is a cross-sectional view schematically illustrating a method for manufacturing a printed wiring board according to an embodiment of the present invention;

FIG. 3D is a cross-sectional view schematically illustrating a method for manufacturing a printed wiring board according to an embodiment of the present invention;

FIG. 3G is a cross-sectional view schematically illustrating a method for manufacturing a printed wiring board according to an embodiment of the present invention;

FIG. 3H is a cross-sectional view schematically illustrating a method for manufacturing a printed wiring board according to an embodiment of the present invention;

FIG. 3I is a cross-sectional view schematically illustrating a method for manufacturing a printed wiring board according to an embodiment of the present invention.

DETAILED DESCRIPTION OF THE EMBODIMENTS

Figure 2:
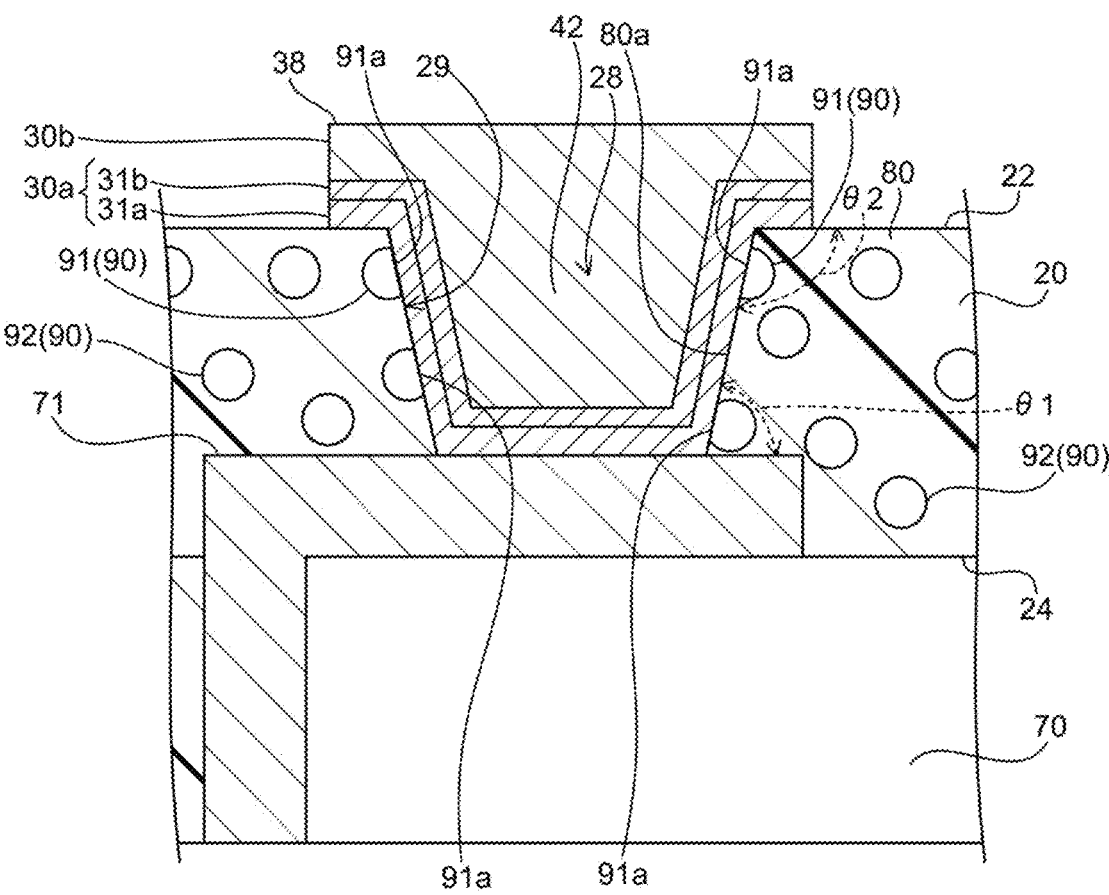
FIG. 2 is an enlarged cross-sectional view schematically illustrating a portion of a printed wiring board according to an embodiment of the present invention.

Embodiments will now be described with reference to the accompanying drawings, wherein like reference numerals designate corresponding or identical elements throughout the various drawings.

Figure 1:
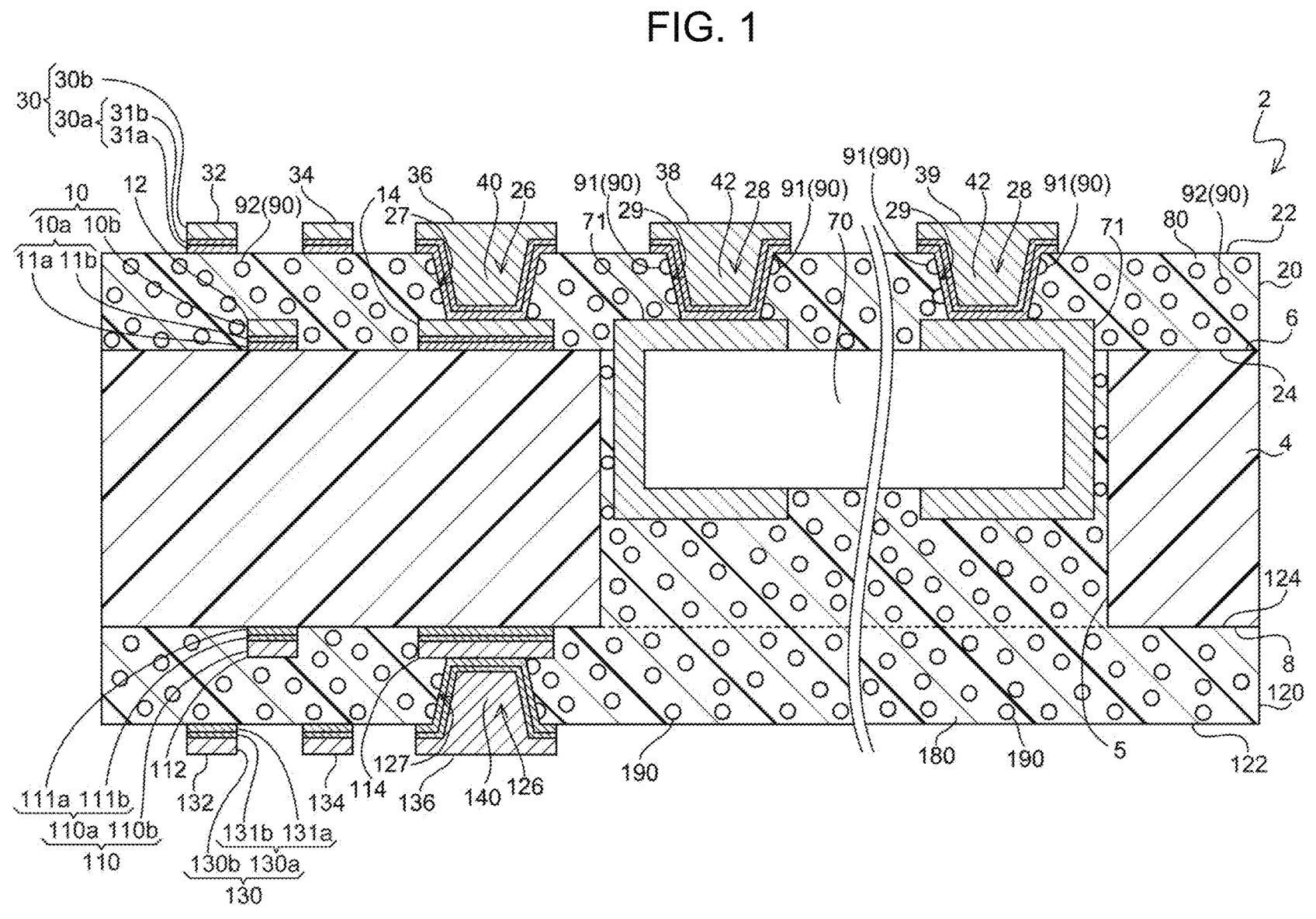

FIG. 1 is a cross-sectional view illustrating a printed wiring board 2 of an embodiment. FIG. 2 is an enlarged cross-sectional view illustrating a part of the printed wiring board 2 of the embodiment. As illustrated in FIG. 1, the printed wiring board 2 includes a base substrate 4, an electronic component 70, a first conductor layer 10, a first resin insulating layer 20, a second conductor layer 30, a via conductor 40, via conductors 42, a via conductor 140, a third conductor layer 110, a second resin insulating layer 120, and a fourth conductor layer 130.

The base substrate 4 is formed using a resin. The base substrate 4 may contain inorganic particles such as silica particles. The base substrate 4 may contain a reinforcing material such as a glass cloth. The base substrate 4 has a third surface 6 (upper surface in the drawing) and a fourth surface 8 (lower surface in the drawing) on the opposite side with respect to the third surface 6. A through hole for a through-hole conductor connecting the first conductor layer 10 and the third conductor layer 110 may be formed in the base substrate 4. A cavity 5 accommodating the electronic component 70 is formed in the base substrate 4.

The electronic component 70 is accommodated in the cavity 5 of the base substrate 4. The electronic component 70 has a pair of electrodes 71. The electronic component 70 is, for example, a capacitor.

The first conductor layer 10 is formed on the third surface 6 of the base substrate 4. The first conductor layer 10 includes a signal wiring 12 and a pad 14. The first conductor layer 10 may also include a conductor circuit other than the signal wiring 12 and the pad 14. The first conductor layer 10 is mainly formed of copper. The first conductor layer 10 is formed of a seed layer (10a) on the base substrate 4 and an electrolytic plating layer (10b) on the seed layer (10a). The seed layer (10a) is formed of a metal foil (11a) on the third surface 6 and an electroless plating layer (11*b*) on the metal foil (11*a*). The metal foil (11*a*) is in contact with the base substrate 4.

The first resin insulating layer 20 is formed on the third surface 6 of the base substrate 4 and on the first conductor layer 10. The first resin insulating layer 20 has a first surface 22 (upper surface in the drawing) and a second surface 24 (lower surface in the drawing) on the opposite side with respect to the first surface 22. The second surface 24 of the first resin insulating layer 20 faces the first conductor layer 10. The first resin insulating layer 20 contains a resin 80 and a large number of inorganic particles 90. The first resin insulating layer 20 has a via hole 26 and via holes 28 as through holes that penetrate the first resin insulating layer 20 in a thickness direction. A pair of via holes 28 are provided in the first resin insulating layer 20. The pair of via holes 28 are respectively connected to the pair of electrodes 71 of the electronic component 70. An inner wall surface 29 of each of the via holes 28 is formed of the resin 80 and the inorganic particles 90. The inner wall surface 29 is formed smooth.

For the resin 80, for example, a thermosetting resin or a photocurable resin may be used. For the resin 80, as an example, an epoxy resin is used.

The large number of inorganic particles 90 are dispersed in the resin 80. For the inorganic particles 90, for example, silica or alumina particles may be used. The inorganic particles 90 have, for example, an average particle size of 0.5 μm and particle sizes in a range of 0.1 μm or more and 5.0 μm or less.

As illustrated in FIGS. 1 and 2, the inorganic particles 90 include first inorganic particles 91 and second inorganic particles 92. The first inorganic particles 91 have first smooth surfaces (91*a*) that form the inner wall surface 29 of each of the via holes 28. The second inorganic particles 92 are embedded in the resin 80. The second inorganic particles 92 each have, for example, a spherical shape. The first inorganic particles 91 each have, for example, a shape obtained by cutting a sphere with a plane. For example, the shapes of the first inorganic particles 91 are obtained by cutting the second inorganic particles 92 with a plane. The first inorganic particles 91 and the second inorganic particles 92 are different in shape. The first smooth surfaces (91*a*) are cut surfaces of the first inorganic particles 91.

As illustrated in FIG. 1, the first surface 22 of the first resin insulating layer 20 is formed only of the resin 80. No inorganic particles 90 are exposed from the first surface 22. Specifically, the second inorganic particles 92 are not exposed from the first surface 22. The first surface 22 does not include surfaces of the second inorganic particles 92. No unevenness is formed on the first surface 22 of the first resin insulating layer 20. The first surface 22 is not roughened. The first surface 22 is formed smooth. The first surface 22 has, for example, an arithmetic mean roughness (Ra) of 0.02 μm or more and 0.06 μm or less.

As illustrated in FIG. 2, the inner wall surface 29 of each of the via holes 28 is formed of a surface (80*a*) of the resin 80 and the first smooth surfaces (91*a*) of the first inorganic particles 91. The surface (80*a*) and the first smooth surfaces (91*a*) form a substantially common surface. In other words, the surface (80*a*) and the first smooth surfaces (91*a*) are flush with each other. Therefore, no unevenness is formed on the inner wall surface 29. That is, the inner wall surface 29 is formed smooth. The inner wall surface 29 has, for example, an arithmetic mean roughness (Ra) of 1.0 μm or less. In other words, the surface (80*a*) and the first smooth surfaces (91*a*) that form the inner wall surface 29 each have, for example, an arithmetic mean roughness (Ra) of 1.0 μm or less.

As illustrated in FIG. 2, the inner wall surface 29 of each of the via holes 28 is inclined. An angle (inclination angle) (θ1) between an upper surface of an electrode 71 and the inner wall surface 29 is, for example, 70 degrees or more and 85 degrees or less. The upper surface of the electrode 71 is, for example, parallel to an upper surface of the first conductor layer 10. An angle (inclination angle) (θ2) between the first surface (upper surface) 22 of the first resin insulating layer 20 and the inner wall surface 29 is, for example, 95 degrees or more and 110 degrees or less.

Similarly to the inner wall surface 29 of each of the via holes 28, an inner wall surface 27 of the via hole 26 may be formed of the surface (80*a*) of the resin 80 and the first smooth surfaces (91*a*) of the first inorganic particles 91. Further, the surface (80*a*) and the first smooth surfaces (91*a*), which form the inner wall surface 27, form a substantially common surface. In this case, similar to the inner wall surface 29, the inner wall surface 27 is smooth.

As illustrated in FIG. 1, the second conductor layer 30 is formed on the first surface 22 of the first resin insulating layer 20. The second conductor layer 30 includes a first signal wiring 32, a second signal wiring 34, a land 36, a land 38, and a land 39. The second conductor layer 30 may include a conductor circuit other than the first signal wiring 32, the second signal wiring 34, the land 36, the land 38, and the land 39. The first signal wiring 32 and the second signal wiring 34 form a pair wiring. The second conductor layer 30 is mainly formed of copper. The second conductor layer 30 is formed by a seed layer (30*a*) on the first surface 22 and an electrolytic plating layer (30*b*) on the seed layer (30*a*). The seed layer (30*a*) is formed of a first layer (31*a*) on the first surface 22 and a second layer (31*b*) on the first layer (31*a*). The first layer (31*a*) is formed of an alloy (copper alloy) containing copper, silicon and aluminum. The second layer (31*b*) is formed of copper. The electrolytic plating layer (30*b*) is formed of copper. The first layer (31*a*) is in contact with the first surface 22. The second layer (31*b*) adheres to the electrolytic plating layer (30*b*). A surface of the second conductor layer 30 facing the first surface 22 of the first resin insulating layer 20 is formed along a surface shape of the first surface 22. The second conductor layer 30 does not enter an inner side of the first surface 22 of the first resin insulating layer 20.

The via conductor 40 is formed in the via hole 26. The via conductor 40 connects the first conductor layer 10 and the second conductor layer 30. In FIG. 1, the via conductor connects the pad 14 and the land 36. The via conductor 40 is formed of a seed layer (30*a*) and an electrolytic plating layer (30*b*) on the seed layer (30*a*). The first layer (31*a*) is in contact with the inner wall surface 27 of the via hole 26.

The via conductors 42 are respectively formed in the via holes 28. The via conductors 42 connect the electrodes 71 of the electronic component 70 and the second conductor layer 30. In FIG. 1, one of the via conductors 42 connects one of the electrodes 71 and the land 38, and the other of the via conductors 42 connects the other of the electrodes 71 and the land 39. The via conductors 42 are each formed of a seed layer (30*a*) and an electrolytic plating layer (30*b*) on the seed layer (30*a*). The seed layer (30*a*) that forms the via conductor 40, the seed layer (30*a*) that forms each of the via conductors 42, and the seed layer (30*a*) that forms the second conductor layer 30 are common. The first layer (31*a*) is in contact with the inner wall surface 29.

The third conductor layer 110 is formed on the fourth surface 8 of the base substrate 4. The third conductor layer 110 includes a signal wiring 112 and a pad 114. The third conductor layer 110 may also include a conductor circuit other than the signal wiring 112 and the pad 114. The third conductor layer 110 is mainly formed of copper. The third conductor layer 110 is formed of a seed layer (110a) on the base substrate 4 and an electrolytic plating layer (110b) on the seed layer (110a). The seed layer (110a) is formed of a metal foil (111a) on the fourth surface 8 and an electroless plating layer (111b) on the metal foil (111a). The metal foil (111a) is in contact with the base substrate 4.

The second resin insulating layer 120 is formed on the fourth surface 8 of the base substrate 4 and on the third conductor layer 110. The second resin insulating layer 120 has a first surface 122 (lower surface in the drawing) and a second surface 124 (upper surface in the drawing) on the opposite side with respect to the first surface 122. The second surface 124 of the second resin insulating layer 120 faces the third conductor layer 110. The second resin insulating layer 120 contains a resin 180 and a large number of inorganic particles 190. The resin 180 and the inorganic particles 190 are respectively similar to the resin 80 and the inorganic particles 90 of the first resin insulating layer 20. The second resin insulating layer 120 has a via hole 126 as a through hole that penetrates the second resin insulating layer 120 in the thickness direction.

Similarly to the inner wall surface 29 of each of the via holes 28, an inner wall surface 127 of the via hole 126 may be formed of a surface of the resin 180 and first smooth surfaces of the inorganic particles 190. Further, a surface forming the inner wall surface 127 and the first smooth surfaces may form a substantially common surface. In this case, similar to the inner wall surface 29, the inner wall surface 127 is smooth.

As illustrated in FIG. 1, the first surface 122 of the second resin insulating layer 120 is formed only of the resin 180. No inorganic particles 190 are exposed from the first surface 122. The first surface 122 does not include surfaces of the inorganic particles 190. No unevenness is formed on the first surface 122 of the second resin insulating layer 120. The first surface 122 is not roughened. The first surface 122 is formed smooth. An arithmetic mean roughness (Ra) of the first surface 122 is similar to the arithmetic mean roughness of the first surface 22.

As illustrated in FIG. 1, the fourth conductor layer 130 is formed on the first surface 122 of the second resin insulating layer 120. The fourth conductor layer 130 includes a third signal wiring 132, a fourth signal wiring 134, and a land 136. The fourth conductor layer 130 may include a conductor circuit other than the third signal wiring 132, the fourth signal wiring 134, and the land 136. The third signal wiring 132 and the fourth signal wiring 134 form a pair wiring. The fourth conductor layer 130 is mainly formed of copper. The fourth conductor layer 130 is formed of a seed layer (130a) on the first surface 122 and an electrolytic plating layer (130b) on the seed layer (130a). The seed layer (130a) and the electrolytic plating layer (130b) are similar to the seed layer (30a) and the electrolytic plating layer (30b) of the second conductor layer 30. The seed layer (130a) is formed of a first layer (131a) on the first surface 122 and a second layer (131b) on the first layer (131a). The first layer (131a) is formed of an alloy (copper alloy) containing copper, silicon and aluminum. The second layer (131b) is formed of copper. The electrolytic plating layer (130b) is formed of copper. The first layer (131a) is in contact with the first surface 122. The second layer (131b) adheres to the electrolytic plating layer (130b). A surface of the fourth conductor layer 130 facing the first surface 122 of the second resin insulating layer 120 is formed along a surface shape of the first surface 122. The fourth conductor layer 130 does not enter an inner side of the first surface 122 of the second resin insulating layer 120.

The via conductor 140 is formed in the via hole 126. The via conductor 140 connects the third conductor layer 110 and the fourth conductor layer 130. In FIG. 1, the via conductor 140 connects the pad 114 and the land 136. The via conductor 140 is formed of a seed layer (130a) and an electrolytic plating layer (130b) on the seed layer (130a). The first layer (131a) is in contact with the inner wall surface 127 of the via hole 126.

Method for Manufacturing Printed Wiring Board

Figure 3A:
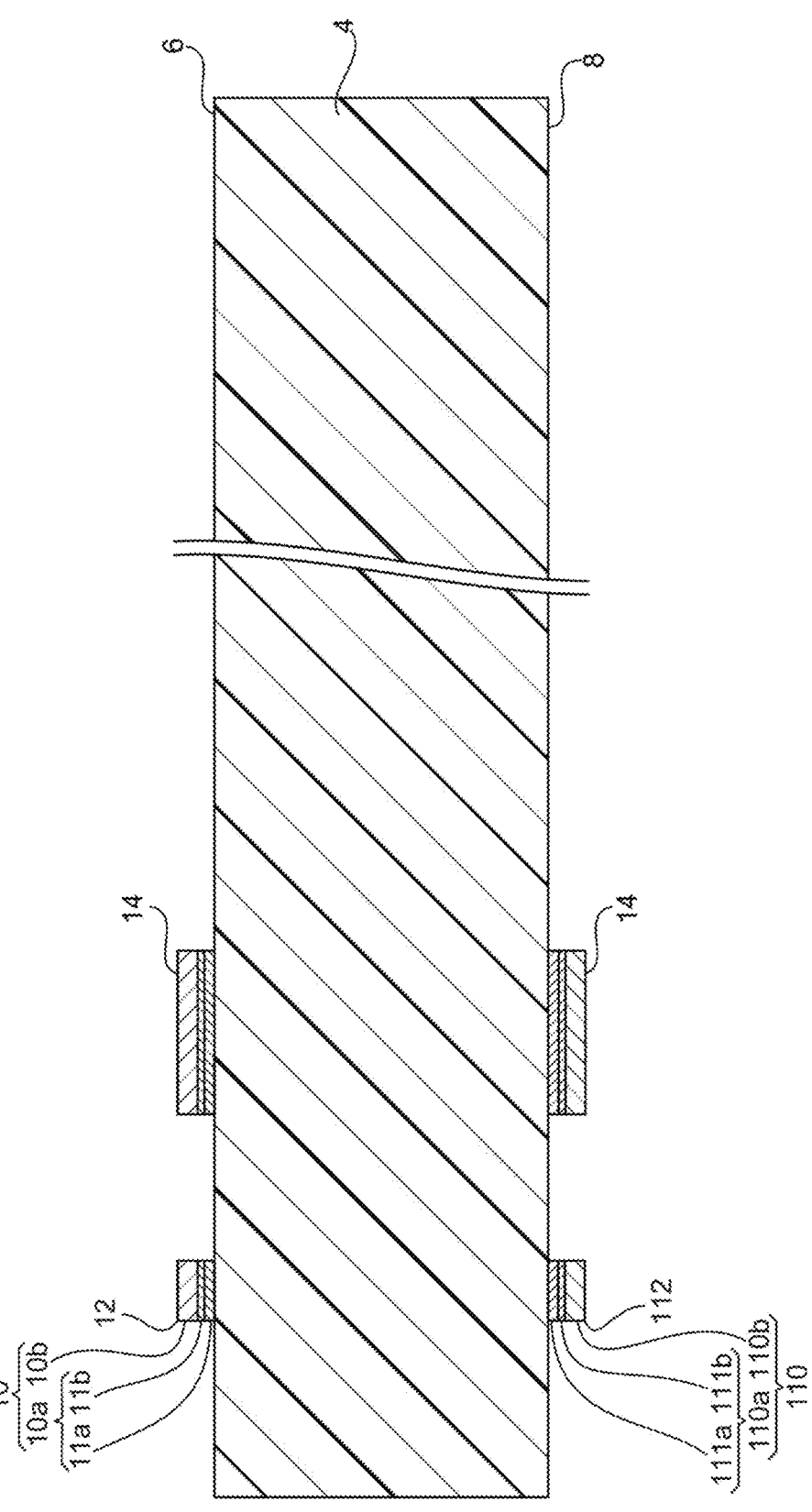
FIG. 3A is a cross-sectional view schematically illustrating a method for manufacturing a printed wiring board according to an embodiment of the present invention.
Figure 3B:
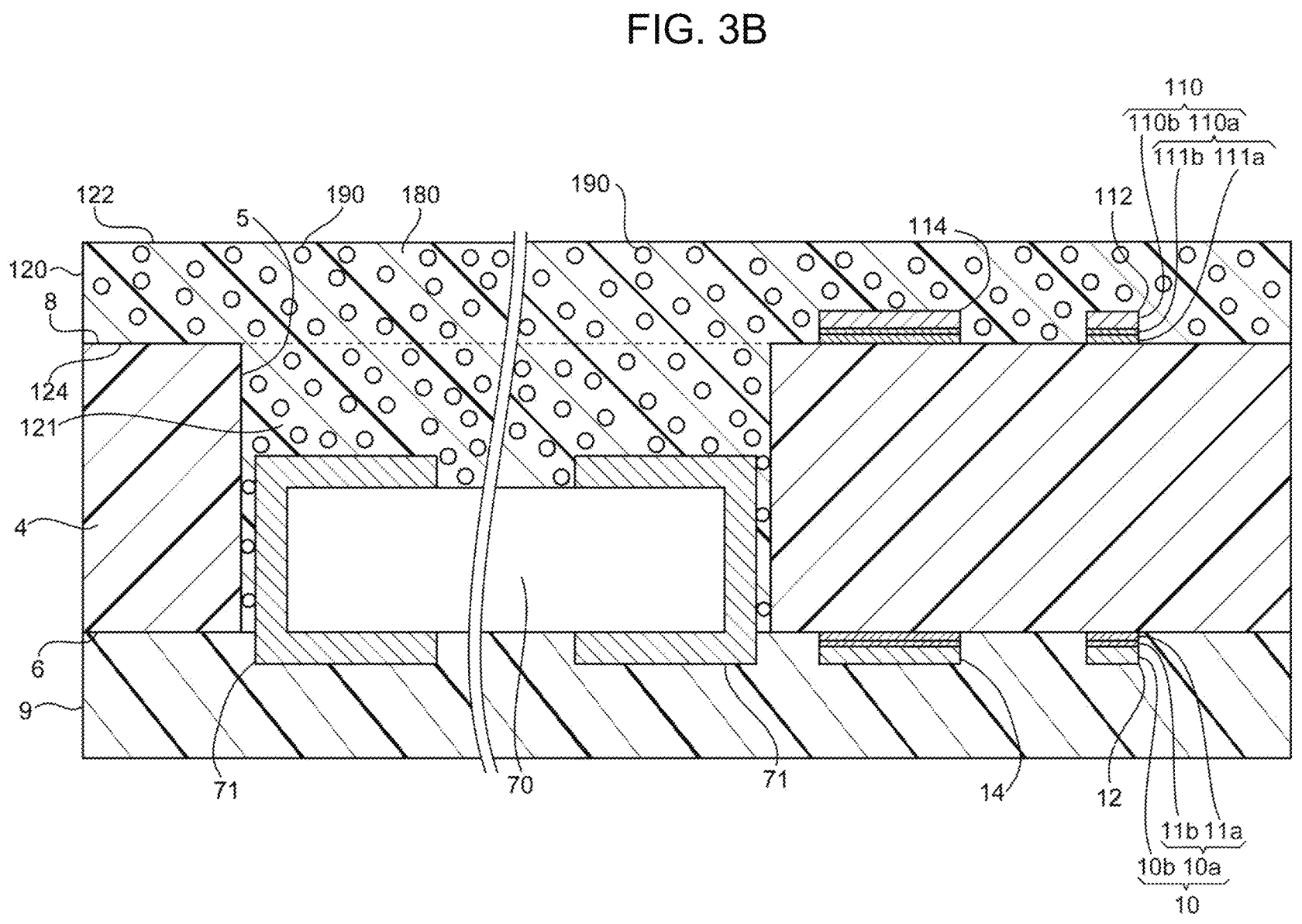
Figure 3C:
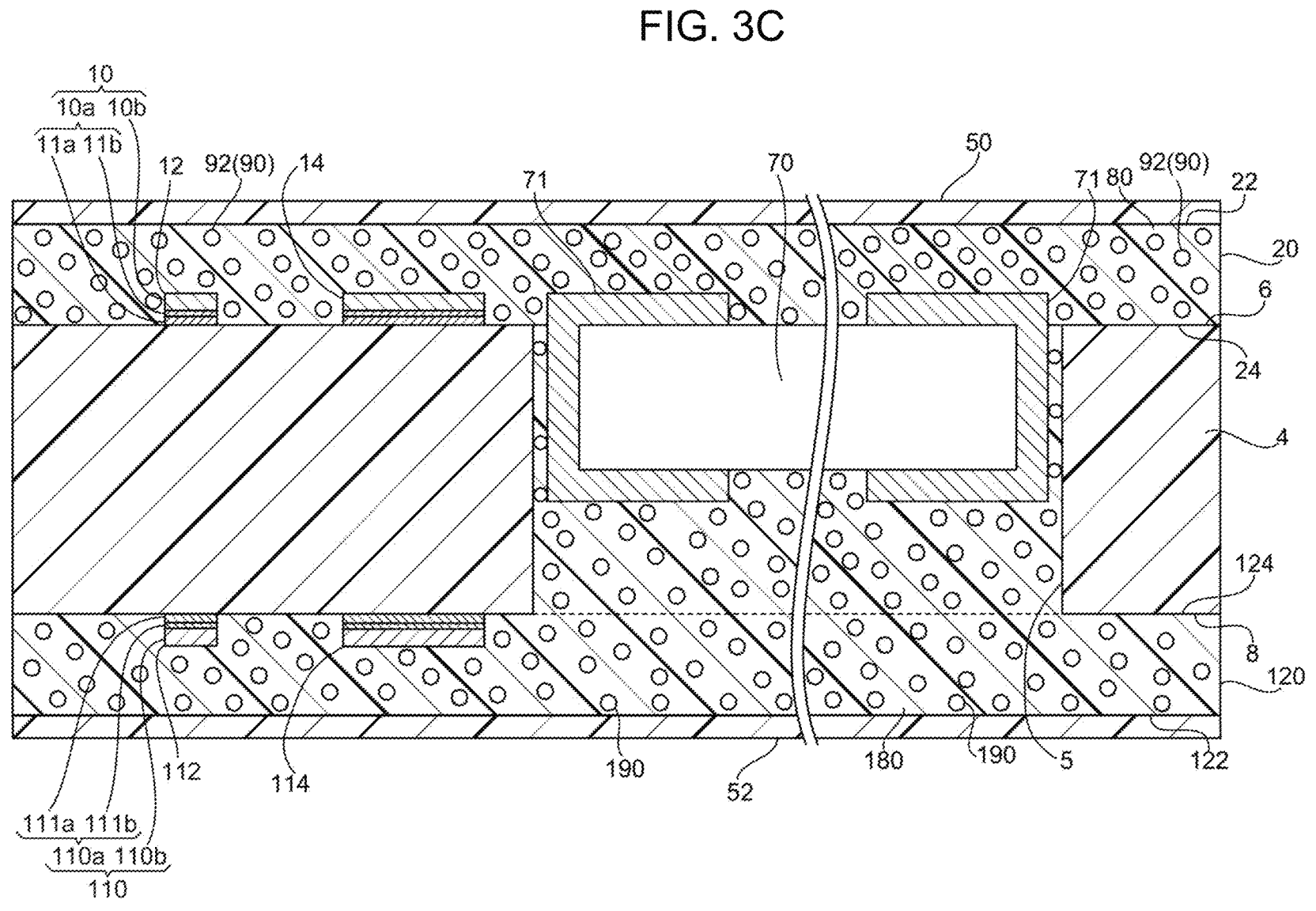
Figure 3D:
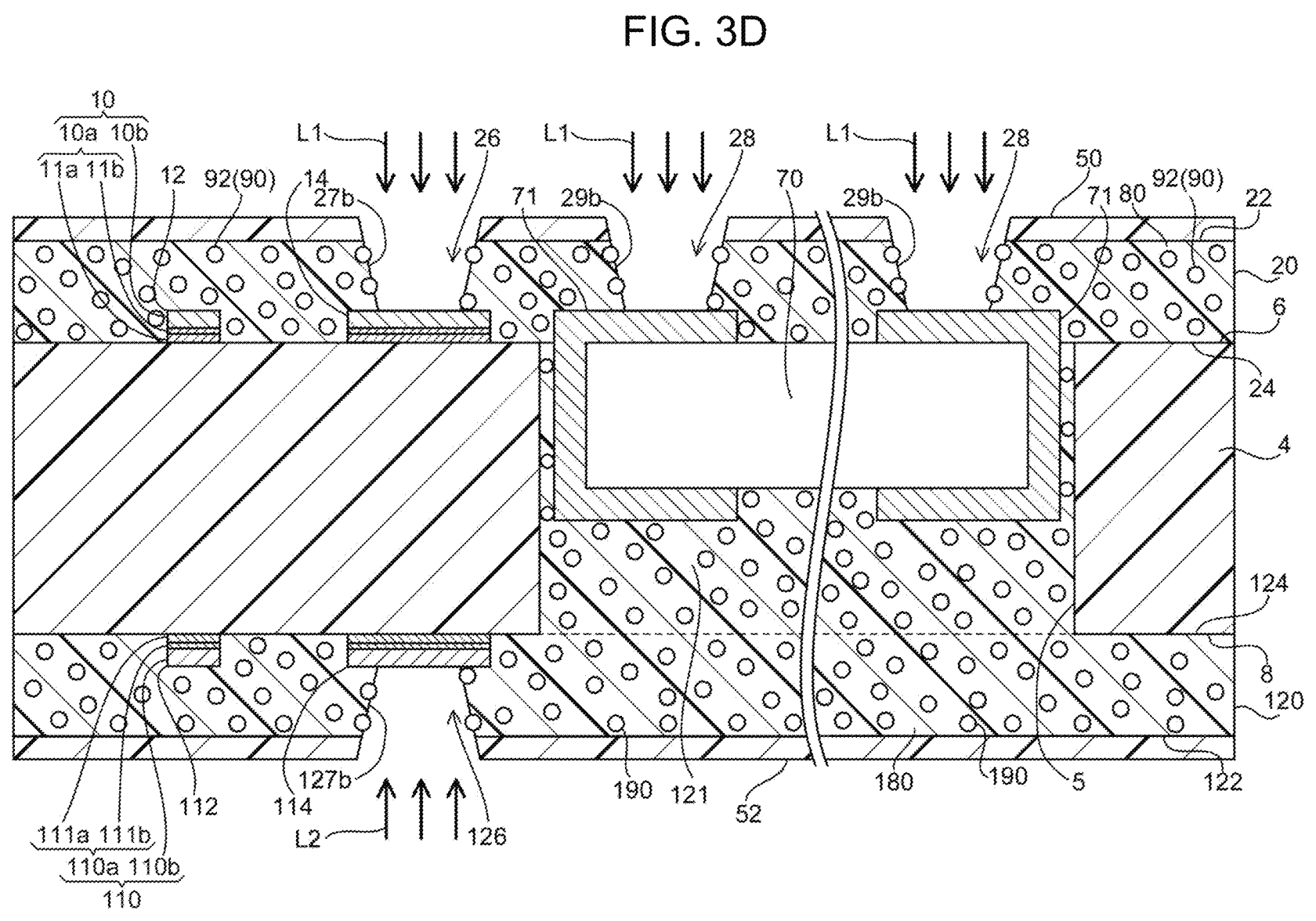
Figure 3E:
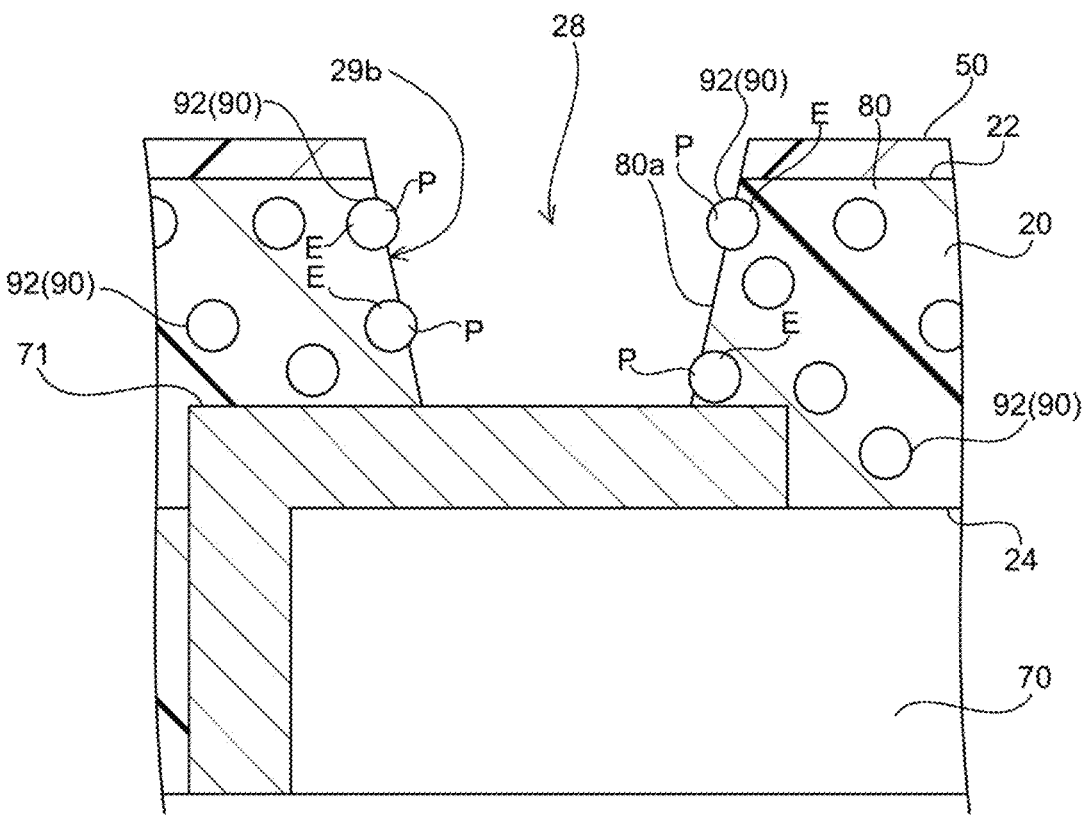
FIG. 3E is an enlarged cross-sectional view schematically illustrating a method for manufacturing a printed wiring board according to an embodiment of the present invention.

FIGS. 3A-3I illustrate a method for manufacturing the printed wiring board 2 of the embodiment. FIGS. 3A-3D and 3F—3I are cross-sectional views. FIG. 3E is an enlarged cross-sectional view. FIG. 3A illustrates the base substrate 4 and the first conductor layer 10 formed on the third surface 6 of the base substrate 4. Further, FIG. 3A illustrates the base substrate 4 and the third conductor layer 110 formed on the fourth surface 8 of the base substrate 4. The first conductor layer 10 is formed using a subtractive method. The electroless plating layer (11b) is formed by electroless plating on the metal foil (11a) formed on the third surface 6. The electrolytic plating layer (10b) is formed by electrolytic plating. Similarly, the third conductor layer 110 is formed using a subtractive method. The electroless plating layer (111b) is formed by electroless plating on the metal foil (111a) formed on the fourth surface 8. The electrolytic plating layer (110b) is formed by electrolytic plating.

As illustrated in FIG. 3B, the cavity 5 for accommodating the electronic component 70 is formed in the base substrate 4. The cavity 5 is a through hole that penetrates the base substrate 4 in the thickness direction, and is formed by machining with a drill, or irradiation with laser, or the like.

The electronic component 70 is accommodated in the cavity 5 of the base substrate 4. Then, an adhesive tape 9 is formed on the third surface 6 of the base substrate 4 so as to close an opening of the cavity 5.

The second resin insulating layer 120 is formed on the base substrate 4 and the third conductor layer 110. Further, a part of the second resin insulating layer 120 is filled into a gap between an inner wall of the cavity 5 and the electronic component 70. The second resin insulating layer 120 and a filling resin 121 in the cavity are temporarily cured. The second surface 124 of the second resin insulating layer 120 faces the fourth surface 8 of the base substrate 4. The second resin insulating layer 120 contains the resin 180 and the inorganic particles 190. The inorganic particles 190 are embedded in the resin 180.

The adhesive tape 9 is peeled off from the third surface 6 of the base substrate 4. As illustrated in FIG. 3C, the first resin insulating layer 20 is formed on the base substrate 4 and the first conductor layer 10. The second surface 24 of the first resin insulating layer 20 faces the third surface 6 of the base substrate 4. The first resin insulating layer 20 contains the resin 80 and the inorganic particles 90 (the second inorganic particles 92). The inorganic particles 90 are embedded in the resin 80.

A protective film 50 is formed on the first surface 22 of the first resin insulating layer 20. The protective film 50 completely covers the first surface 22 of the first resin insulating layer 20. The protective film 50 is, for example, a film formed of polyethylene terephthalate (PET). A layer of a release agent is formed between the protective film 50 and the first resin insulating layer 20.

A protective film 52 is formed on the first surface 122 of the second resin insulating layer 120. The protective film 52 completely covers the first surface 122 of the second resin insulating layer 120. The protective film 52 is, for example, a film formed of polyethylene terephthalate (PET). A layer of a release agent is formed between the protective film 52 and the second resin insulating layer 120.

As illustrated in FIG. 3D, laser (L1) is irradiated from above the protective film 50. The laser (L1) penetrates the protective film 50 and the first resin insulating layer 20. The via hole 26 for a via conductor reaching the pad 14 of the first conductor layer 10 is formed. Further, the via holes 28 for via conductors reaching the pair of electrons 71 of the electronic component 70 are respectively formed. The laser (L1) is, for example, UV laser, or $CO_2$ laser. The pad 14 is exposed from the via hole 26. Further, the electrodes 71 are respectively exposed from the via holes 28. When the via hole 26 and the via holes 28 are formed, the first surface 22 is covered by the protective film 50. Therefore, when the via hole 26 and the via holes 28 are formed, even when the resin scatters, adherence of the resin to the first surface 22 is suppressed.

Laser (L2) is irradiated from above the protective film 52. The laser (L2) penetrates the protective film 52 and the second resin insulating layer 120. The via hole 126 for a via conductor reaching the pad 114 of the third conductor layer 110 is formed. The laser (L2) is similar to the laser light (L1). The pad 114 is exposed from the via hole 126. When the via hole 126 is formed, the first surface 122 is covered by the protective film 52. Therefore, when the via hole 126 is formed, even when the resin scatters, adherence of the resin to the first surface 122 is suppressed.

FIG. 3E illustrates an inner wall surface (29*b*) of one of the via holes 28 after the laser irradiation. The inner wall surface (29*b*) is formed of the resin 80 and the inorganic particles 90 protruding from the resin 80. In order to control a shape of the inner wall surface, the inner wall surface (29*b*) after the laser irradiation is treated. It is preferable to selectively remove the inorganic particles 90 protruding from the resin 80. By the removal, the first inorganic particles 91 are formed from the inorganic particles 90. For example, the inorganic particles 90 protruding from the resin 80 may be selectively removed by treating the inner wall surface (29*b*) after the laser irradiation with a chemical. Or, the inorganic particles 90 protruding from the resin 80 may be selectively removed by treating the inner wall surface (29*b*) after the laser irradiation with plasma. The selectively removing of the inorganic particles 90 includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (29*b*) after the laser irradiation, the first inorganic particles 91 having the first smooth surfaces (91*a*) (see FIG. 2) are obtained. Further, by controlling conditions for treating the inner wall surface (29*b*) after the laser irradiation, the shape of the inner wall surface (29*b*) can be controlled. Examples of the conditions are a temperature, a concentration, a time, a type of gas, and a pressure. The etching rate of the inorganic particles 90 and the etching rate of the resin are controlled.

By irradiating the first resin insulating layer 20 with the laser (L1), some of the second inorganic particles 92 embedded in the resin 80 form the inner wall surface (29*b*) after the laser irradiation. The second inorganic particles 92 forming the inner wall surface (29*b*) after the laser irradiation are each formed of a protruding portion (P) protruding from the resin 80 and a portion (E) embedded in the resin 80. The inner wall surface (29*b*) after the laser irradiation is treated. For example, the inner wall surface (29*b*) is treated with plasma of a gas containing tetrafluoromethane. The protruding portions (P) are selectively removed and the inner wall surface 29 (see FIGS. 1 and 2) of the embodiment is formed. The first inorganic particles 91 are formed from the second inorganic particles 92. By selectively removing the protruding portions (P), the first inorganic particles 91 having the first smooth surfaces (91*a*) are formed. When the second inorganic particles 92 having spherical shapes are cut along a flat surface, the shapes of the first inorganic particles 91 are obtained. The inner wall surface 29 is formed of the surface (80*a*) of the resin 80 and the first smooth surfaces (91*a*) of the first inorganic particles 91, and the surface (80*a*) and the first smooth surfaces (91*a*) are positioned on substantially the same plane. For example, when the seed layer (30*a*) is formed on the inner wall surface (29*b*) by sputtering, the protruding portions (P) inhibit growth of a sputtering film. For example, a continuous seed layer (30*a*) is not formed on the inner wall surface (29*b*). Or, the seed layer (30*a*) is increased in thickness. A fine conductor circuit cannot be formed. In the embodiment, the projecting portions (P) are removed. The seed layer (30*a*) formed by sputtering can be reduced in thickness. Even when the seed layer (30*a*) formed by sputtering is thin, a continuous seed layer (30*a*) can be obtained.

No unevenness is formed on the inner wall surface 29. The inner wall surface 29 is formed smooth. By controlling the conditions for treating the inner wall surface (29*b*) after the laser irradiation, a size of unevenness is controlled.

An inner wall surface (27*b*) of the via hole 26 may be subjected to the same treatment as the inner wall surface (29*b*) of each of the via holes 28 after laser irradiation. By performing the same treatment, the inner wall surface 27 is formed smooth. Further, an inner wall surface (127*b*) of the via hole 126 may be subjected to the same treatment as the inner wall surface (29*b*) of each of the via holes 28 after laser irradiation. By performing the same treatment, the inner wall surface 127 is formed smooth.

Inside of the via hole 26, insides of the via holes 28, and inside of the via hole 126 are cleaned. By cleaning the inside of the via hole 26, the insides of the via holes 28, and the inside of the via hole 126, resin residues generated in the via hole 26, the via holes 28, and the via hole 126 when the via hole 26, the via holes 28, and the via hole 126 are formed are removed. The cleaning of the inside of the via hole 26, the insides of the via holes 28, and the inside of the via hole 126 is performed using plasma. That is, the cleaning is performed with a dry process. A gas of the dry process is a mixed gas of a halogen-based gas (such as a fluorine-based gas or a chlorine-based gas) and an O2 gas or is a halogen-based gas (such as a fluorine-based gas or a chlorine-based gas) or an O2 gas alone. The cleaning includes a desmear treatment. The first surface 22 of the first resin insulating layer 20 is covered by the protective film 50, and thus, is not affected by the plasma. No unevenness is formed on the first surface 22 of the first resin insulating layer 20. The first surface 22 is not roughened. The first surface 122 of the second resin insulating layer 120 is covered by the protective film 52, and thus, is not affected by the plasma. No unevenness is formed on the first surface 122 of the second resin insulating layer 120. The first surface 122 is not roughened.

When treating the inner wall surface (29*b*) after the laser irradiation includes cleaning the insides of the via holes 28, the cleaning of the insides of the via holes 28 may be omitted.

Figure 3F:
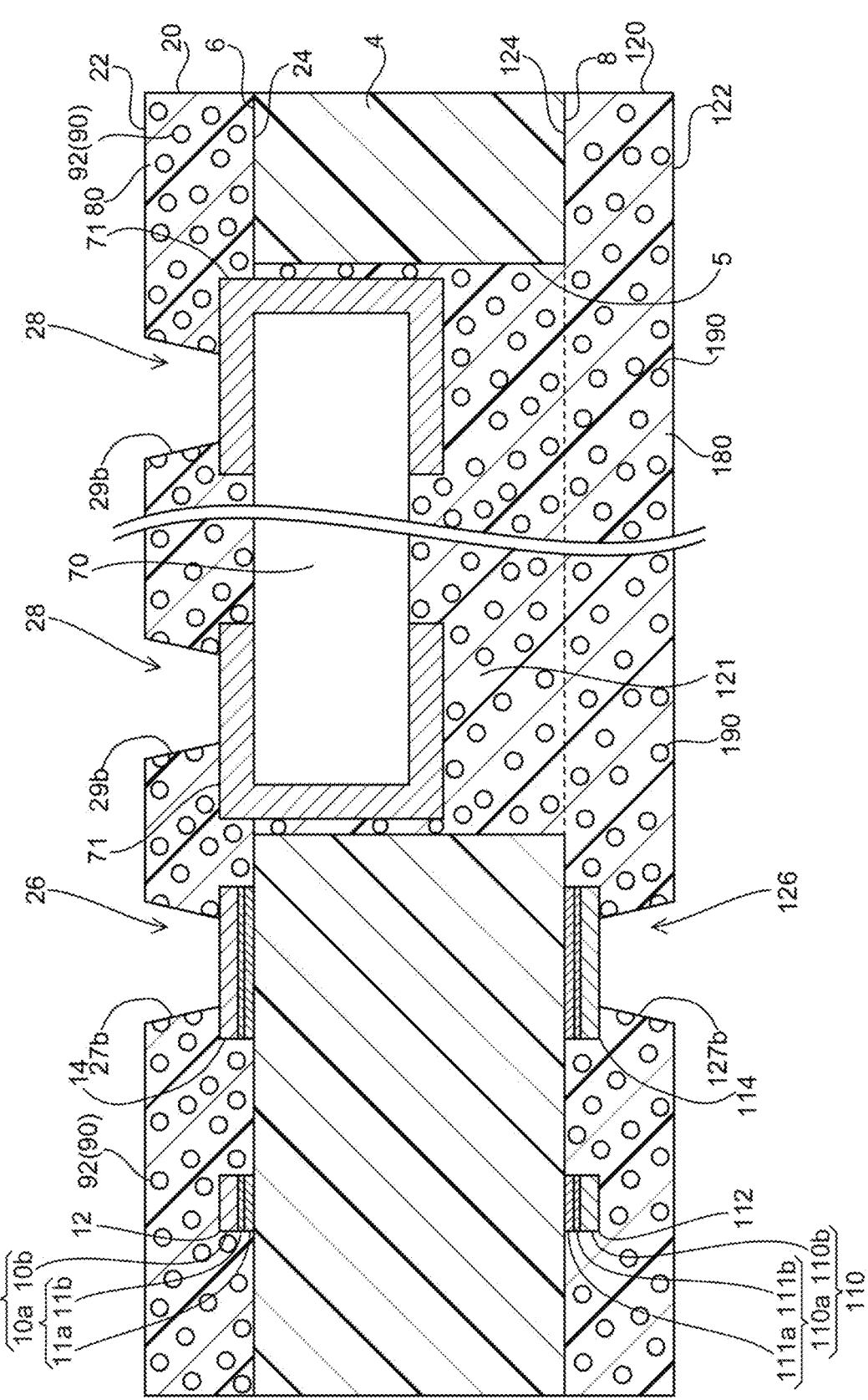
FIG. 3F is a cross-sectional view schematically illustrating a method for manufacturing a printed wiring board according to an embodiment of the present invention.

As illustrated in FIG. 3F, after cleaning the inside of the via hole 26, the insides of the via holes 28, and the inside of the via hole 126, the protective film 50 is removed from the first resin insulating layer 20, and the protective film 52 is removed from the second resin insulating layer 120. When treating the inner wall surface (29*b*) after the laser irradiation includes cleaning the insides of the via holes 28, the protective film 50 is removed from the first resin insulating layer 20 after treating the inner wall surface (29*b*) after the laser irradiation. When the inner wall surface (29*b*) after the laser irradiation is treated, the protective film 50 covers the first surface 22 of the first resin insulating layer 20. After the protective film 50 is removed, the first surface 22 of the first resin insulating layer 20 is not roughened. Therefore, the first surface 22 is formed smooth. When the inner wall surface (127*b*) after the laser irradiation is treated, the protective film 52 covers the first surface 122 of the second resin insulating layer 120. After the protective film 52 is removed, the first surface 122 of the second resin insulating layer 120 is not roughened. Therefore, the first surface 122 is formed smooth. The first surface 22 and the first surface 122 each have, for example, an arithmetic mean roughness (Ra) of 0.02 μm or more and 0.06 μm or less.

Figure 3G:
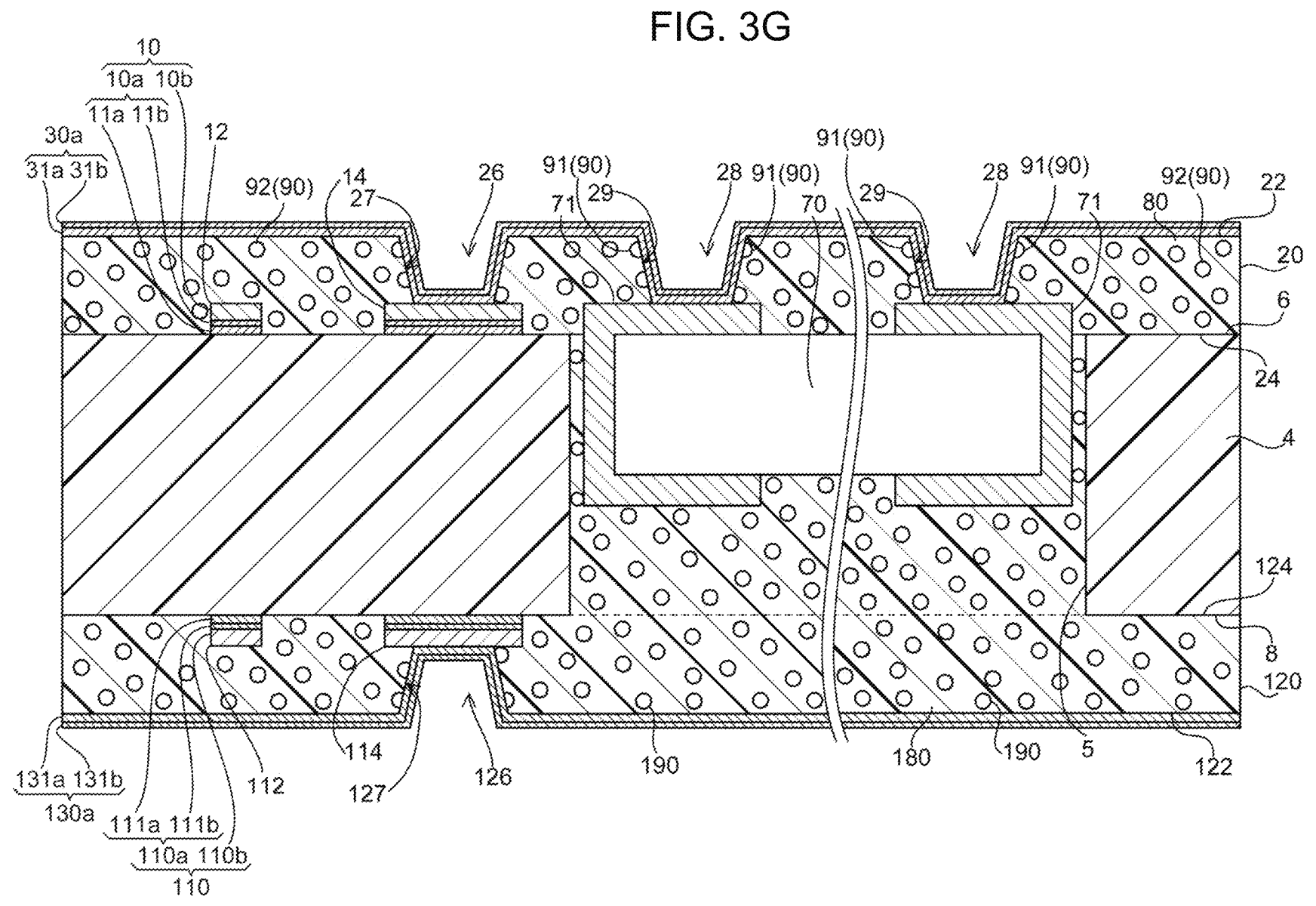

As illustrated in FIG. 3G, the seed layer (30*a*) is formed on the first surface 22 of the first resin insulating layer 20. The seed layer (30*a*) is formed by sputtering. The formation of the seed layer (30*a*) is performed in a dry process. The first layer (31*a*) is formed on the first surface 22 by sputtering. At the same time, the first layer (31*a*) is formed on the inner wall surface 27 and the pad 14, which are exposed from the via hole 26, by sputtering. After that, the second layer (31*b*) is formed on the first layer (31*a*) by sputtering. The seed layer (30*a*) is also formed on the upper surface of the pad 14 exposed from the via hole 26 and on the inner wall surface 27 of the via hole 26. Further, the seed layer (30*a*) is also formed on the upper surfaces of the electrodes 71 exposed from the pair of via holes 28 and on the inner wall surfaces 29 of the via holes 28. The first layer (31*a*) is formed of an alloy containing copper, silicon and aluminum. The second layer (31*b*) is formed of copper.

The seed layer (130*a*) is formed on the first surface 122 of the second resin insulating layer 120 using the same method as the seed layer (30*a*). The seed layer (130*a*) is also formed on an upper surface of the pad 114 exposed from the via hole 126 and on the inner wall surface 127 of the via hole 126. The first layer (131*a*) of the seed layer (130*a*) is formed of an alloy containing copper, silicon, and aluminum. The second layer (131*b*) of the seed layer (130*a*) is formed of copper.

Figure 3H:
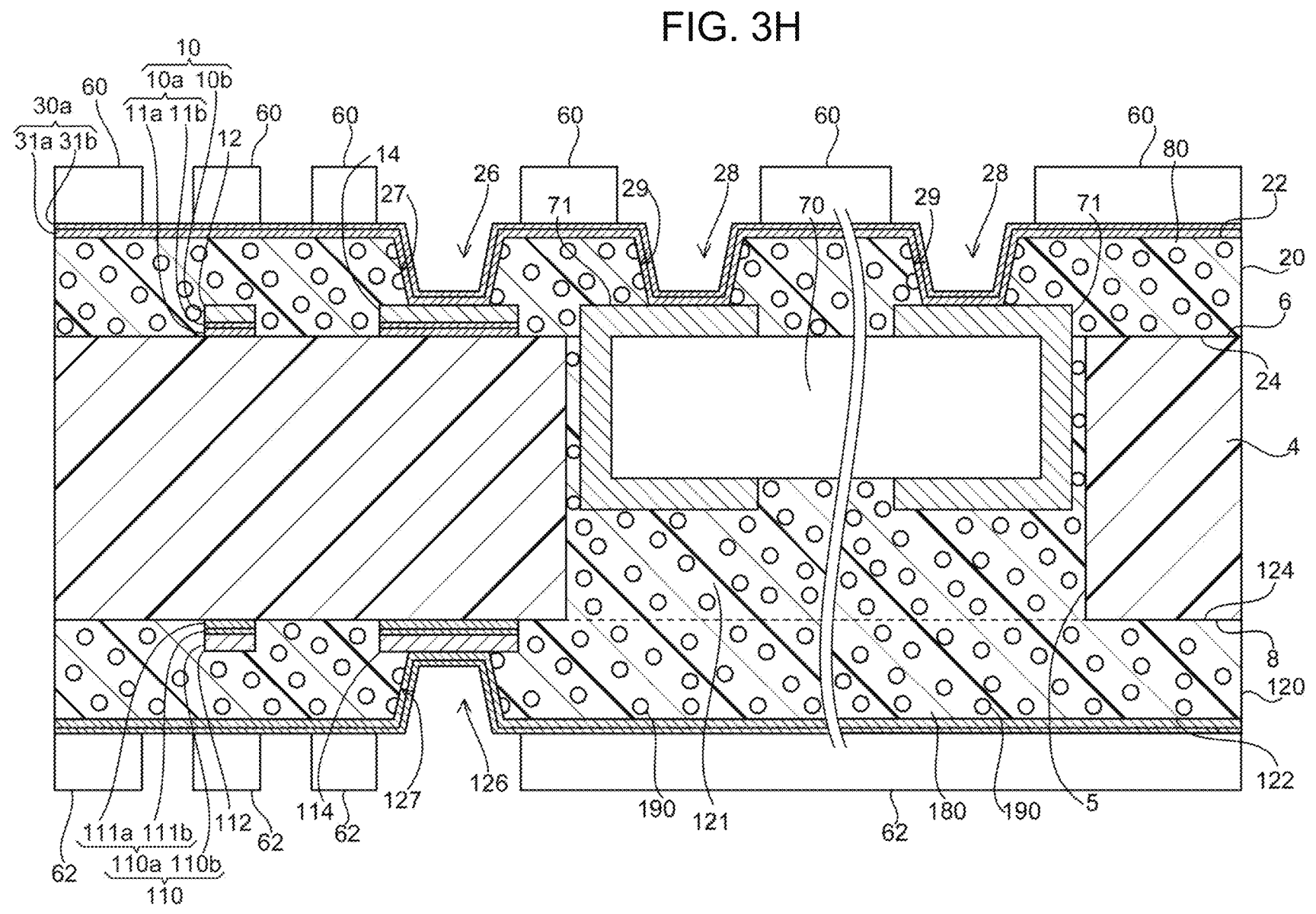

As illustrated in FIG. 3H, a plating resist 60 is formed on the seed layer (30*a*). The plating resist 60 has openings for forming the first signal wiring 32, the second signal wiring 34, the land 36, the land 38, and the land 39 (see FIG. 1). A plating resist 62 is formed on the seed layer (130*a*). The plating resist 62 has openings for forming the third signal wiring 132, the fourth signal wiring 134, and the land 136 (see FIG. 1).

Figure 3I:
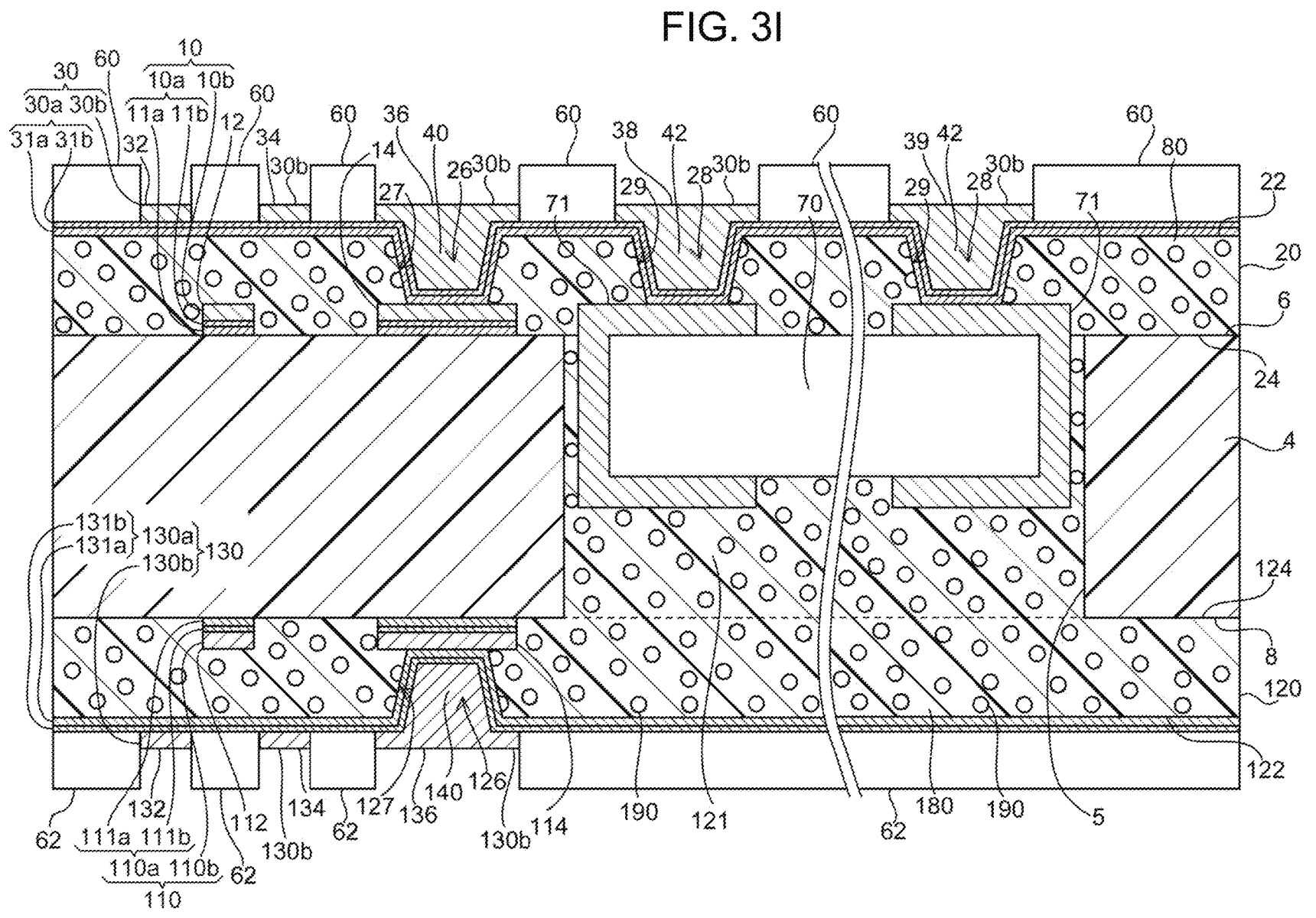

As illustrated in FIG. 3I, the electrolytic plating layer (30*b*) is formed on the seed layer (30*a*) exposed from the plating resist 60. The electrolytic plating layer (30*b*) is formed of copper. The electrolytic plating layer (30*b*) fills the via hole 26 and the pair of via holes 28. The first signal wiring 32, the second signal wiring 34, the land 36, the land 38, and the land 39 are formed by the seed layer (30*a*) and the electrolytic plating layer (30*b*) on the first surface 22. The second conductor layer 30 is formed. The via conductor is formed by the seed layer (30*a*) and the electrolytic plating film (30*b*) in the via hole 26. The via conductor 40 connects the pad 14 and the land 36. The first signal wiring 32 and the second signal wiring 34 form a pair wiring. The via conductors 42 are formed by the seed layer (30*a*) and the electrolytic plating layer (30*b*) in the via holes 28. One of the via conductors 42 connects one of the electrodes 71 and the land 38. The other one of the via conductors 42 connects the other one of the electrodes 71 and the land 39.

The electrolytic plating layer (130*b*) is formed on the seed layer (130*a*) exposed from the plating resist 62. The electrolytic plating layer (130*b*) is formed of copper. The electrolytic plating layer (130*b*) fills the via hole 126. The third signal wiring 132, the fourth signal wiring 134, and the land 136 are formed by the seed layer (130*a*) and the electrolytic plating film (130*b*) on the first surface 122. The fourth conductor layer 130 is formed. The via conductor 140 is formed by the seed layer (130*a*) and the electrolytic plating film (130*b*) in the via hole 126. The via conductor 140 connects the pad 114 and the land 136. The third signal wiring 132 and the fourth signal wiring 134 form a pair wiring.

The plating resists (60, 62) are removed. The seed layer (30*a*) exposed from the electrolytic plating layer (30*b*) is removed by etching. The second conductor layer 30, the via conductor 40, and the via conductors 42 are formed at the same time. The seed layer (130*a*) exposed from the electrolytic plating layer (130*b*) is removed by etching. The fourth conductor layer 130 and the via conductor 140 are formed at the same time. As a result, the printed wiring board 2 of the embodiment (see FIG. 1) is obtained.

In the printed wiring board 2 of the embodiment (see FIGS. 1 and 2), in the first resin insulating layer 20, the inner wall surface 29 of each of the via holes 28 is formed of the surface (80*a*) of the resin 80 and the first smooth surfaces (91*a*) of the first inorganic particles 91. The surface (80*a*) and the first smooth surfaces (91*a*) form a substantially common surface. As a result, the inner wall surface 29 is formed smooth. Therefore, a surface of the seed layer (30*a*) becomes smooth. As a result, a filling property of the electrolytic plating layer (30*b*) is improved. Formation of a stress concentration site (for example, an uneven part) in the electrolytic plating layer (30*b*) that forms an inner layer of each of the via conductors 42 is suppressed. As a result, occurrence of a crack in the electrolytic plating layer (30*b*), which is an inner layer of each of the via conductors 42, can be suppressed. Further, since the inner wall surface 29 is formed smooth, occurrence of a void between the inner wall surface 29 and each of the via conductors 42 is suppressed. Therefore, reliability of the printed wiring board 2 is improved. That is, a high quality printed wiring board 2 is provided.

When the inner wall surface 27 of the via hole 26 is formed smooth by the surface (80*a*) of the resin 80 and the first smooth surfaces (91*a*) of the first inorganic particles 91, similar to the via conductors 42, occurrence of a crack in the electrolytic plating layer (30*b*), which is an inner layer of the via conductor 40, can be suppressed. Further, when the inner wall surface 127 of the via hole 126 is formed smooth by the surface of the resin 180 and the first smooth surfaces of the inorganic particles 190, similar to the via conductors 42, occurrence of a crack in the electrolytic plating layer (130b), which is an inner layer of the via conductor 140, can be suppressed. By suppressing occurrence of cracks in the via conductor 40 and the via conductor 140, the reliability of the printed wiring board 2 is further improved.

When the inner wall surface 27 of the via hole 26 and the inner wall surfaces 29 of the via holes 28 are formed smooth, a seed layer (30a) having a uniform thickness is formed on the inner wall surfaces 29 of the via holes 28 and on the inner wall surface 27 of the via hole 26. The seed layer (30a) is formed thin (see FIG. 3G). Therefore, when the seed layer (30a) is removed, an etching amount is small. Therefore, an etching amount of the electrolytic plating layer (30b) is small. The second conductor layer 30 having the first signal wiring 32 and the second signal wiring 34 has a width as designed. Further, when the inner wall surface 127 of the via hole 126 is formed smooth, a seed layer (130a) having a uniform thickness is formed on the inner wall surface 127 of the via hole 126. The seed layer (130a) is formed thin (see FIG. 3G). Therefore, when the seed layer (130a) is removed, an etching amount is small. Therefore, an etching amount of the electrolytic plating layer (130b) is small. The fourth conductor layer 130 having the third signal wiring 132 and the fourth signal wiring 134 has a width as designed.

In the printed wiring board 2 of the embodiment, the first surface 22 of the first resin insulating layer 20 is formed only of the resin 80. The inorganic particles 90 are not exposed on the first surface 22. Similarly, the first surface 122 of the second resin insulating layer 120 is formed only of the resin 180. The inorganic particles 190 are not exposed on the first surface 122. No unevenness is formed on the first surface 22 and the first surface 122. An increase in standard deviation of a relative permittivity in a portion near the first surface 22 of the first resin insulating layer 20 is suppressed. An increase in standard deviation of a relative permittivity in a portion near the first surface 122 of the second resin insulating layer 120 is suppressed. The relative permittivities of the first surface 22 and the first surface 122 do not vary significantly depending on a location. Even when the first signal wiring 32 and the second signal wiring 34 are in contact with the first surface 22, a difference in propagation speed of an electric signal between the first signal wiring 32 and the second signal wiring 34 can be reduced. Similarly, even when the third signal wiring 132 and the fourth signal wiring 134 are in contact with the first surface 122, a difference in propagation speed of an electric signal between the third signal wiring 132 and the fourth signal wiring 134 can be reduced. Therefore, in the printed wiring board 2 of the embodiment, noise is suppressed. Even when a logic IC is mounted on the printed wiring board 2 of the embodiment, data transmitted via the first signal wiring 32 and the third signal wiring 132 and data transmitted via the second signal wiring 34 and the fourth signal wiring 134 arrive at the logic IC substantially without delay. Malfunction of a logic IC can be suppressed. For example, even when lengths of the first signal wiring 32 and the third signal wiring 132 and lengths of the second signal wiring 34 and the fourth signal wiring 134 are each 5 mm or more, a difference in propagation speed between the two can be reduced. Even when the lengths of the first signal wiring 32 and the third signal wiring 132 and the lengths of the second signal wiring 34 and the fourth signal wiring 134 are each 10 mm or more and 20 mm or less, malfunction of the logic IC can be suppressed. A high quality printed wiring board 2 is provided.

First Alternative Example

In a first alternative example of the embodiment, the first layers (31a, 131a) of the seed layers (30a, 130a) are formed of copper and a second element. The second element is selected from silicon, aluminum, titanium, nickel, chromium, carbon, oxygen, tin, calcium, magnesium, iron, molybdenum, and silver. The first layers (31a, 131a) are formed of an alloy containing copper. The second layers (31b, 131b) are formed of copper. An amount of copper (atomic weight %) forming the second layers (31b, 131b) is 99.9% or more, and preferably 99.95% or more.

It is also possible that the first layers (31a, 131a) of the seed layers (30a, 130a) are formed of any one of silicon, aluminum, titanium, nickel, chromium, carbon, oxygen, tin, calcium, magnesium, iron, molybdenum, and silver.

Second Alternative Example

Figure 4:
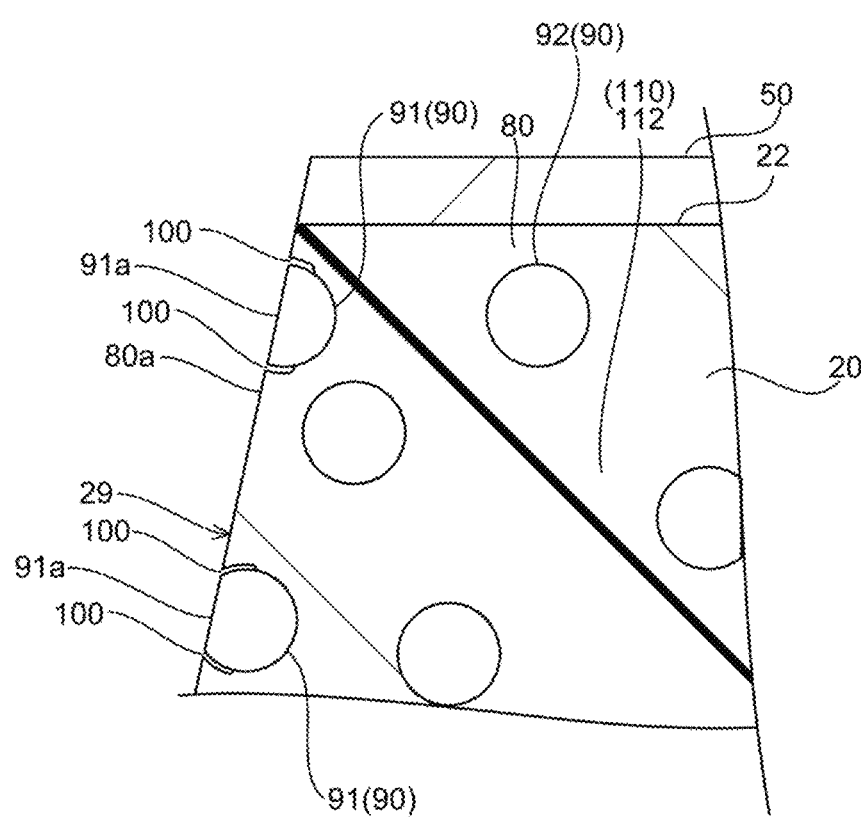
FIG. 4 is an enlarged cross-sectional view schematically illustrating a method for manufacturing a printed wiring board of a second alternative example according to an embodiment of the present invention.

In a second alternative example of the embodiment, the conditions for treating the inner wall surface (29b, 29) after the laser irradiation are controlled. Therefore, as illustrated in FIG. 4, the surface (80a) of the resin 80 and the first smooth surfaces (91a) of the first inorganic particles 91, which form the inner wall surface 29, form substantially the same plane. FIG. 4 is an enlarged cross-sectional view illustrating the inner wall surface 29 after the treatment. Distances between the first smooth surfaces (91a) and the surface (80a) of the resin 80 are 5 μm or less. Therefore, even when there are gaps 100 between the first inorganic particles 91 and the resin 80 formed around the first inorganic particles 91, the seed layer (30a) can be formed in the gaps 100. In this case, the seed layer (30a) is formed on the inner wall surface 29 and in the gaps 100. When distances between the first smooth surfaces (91a) and bottoms of the gaps 100 are 5 μm or less, the seed layer (30a) formed by sputtering is unlikely to peel off from the inner wall surface 29. The distances between the first smooth surfaces (91a) and the bottoms of the gaps 100 are preferably 3 μm or less. Variation in the thickness of the seed layer (30a) on the inner wall surface 29 can be reduced. For the same reason, the seed layer (130a) formed by sputtering is unlikely to peel off from the inner wall surface 127. Similarly, for the inner wall surface 27 and the inner wall surface 127, it is possible to form a seed layer in the gaps.

In the printed wiring board 2, the first resin insulating layer 20 contains the resin 80 and the inorganic particles 90. However, the first resin insulating layer 20 may also contain a fiber reinforcing material. The second resin insulating layer 120 contains the resin 180 and the inorganic particles 190. However, the second resin insulating layer 120 may also contain a fiber reinforcing material. As the fiber reinforcing material, for example, a glass cloth, a glass nonwoven fabric, or an aramid nonwoven fabric may be used. The fiber reinforcement material may be contained in both the first resin insulating layer 20 and the second resin insulating layer 120 or may be contained in only one of the two.

In the printed wiring board 2, one resin insulating layer is laminated on each of both sides of the base substrate. However, it is also possible that two or more resin insulating layers are laminated.

A printed wiring board according to an embodiment of the present invention is not limited to those having the structures exemplified in the drawings and those having the structures, shapes, and materials exemplified in the present specification.

A method for manufacturing a printed wiring board according to an embodiment of the present invention is not limited to the method described with reference to the drawings. For example, the conductor layers may be formed using a full additive method. Further, the insulating layers can each be formed using a resin in any form without being limited to a film-like resin. In the method for manufacturing the printed wiring board of the embodiment, it is also possible that any process other than the processes described above is added, or some of the processes described above are omitted.

In Japanese Patent Application Laid-Open Publication No. 2014-38890, the via conductors for component connection are embedded in via holes provided in an insulating layer. When an inner wall surface (inner peripheral surface) of a via hole has unevenness, a stress is likely to concentrate in a site corresponding to the unevenness on an outer wall surface (outer peripheral surface) of a via conductor for component connection. It is thought that, when a stress is concentrated on a via conductor for component connection, a crack occurs in the via conductor.

A printed wiring board according to an embodiment of the present invention includes a base substrate in which a cavity is formed, an electronic component accommodated in the cavity, a first conductor layer formed on the base substrate, a resin insulating layer that is formed on the first conductor layer, contains a resin and inorganic particles, and has via holes connected to electrodes of the electronic component, a second conductor layer formed on the resin insulating layer, and via conductors that are formed in the via holes and connect the second conductor layer and the electrodes. An inner wall surface of each of the via holes of the resin insulating layer is formed of the resin and the inorganic particles, the inorganic particles include first inorganic particles having first smooth surfaces forming the inner wall surface, and second inorganic particles embedded in the resin insulating layer, and the via conductors are each formed of a seed layer and an electrolytic plating layer on the seed layer.

In a printed wiring board according to an embodiment of the present invention, the resin insulating layer contains the inorganic particles and the resin. The resin insulating layer has the via holes connected to the electrodes of the electronic component. The inner wall surface of each of the via holes is in contact with the seed layer of the via conductors. The inner wall surface of each of the via holes is formed of the resin and the inorganic particles. By making the inner wall surface of each of the via holes smooth, a surface of the seed layer formed on the inner wall surface becomes smooth, and a filling property of the electrolytic plating layer is improved. As a result, formation of a stress concentration site in the electrolytic plating layer that forms an inner layer of the via conductors is suppressed. Occurrence of a crack in the inner layer of the via conductors can be suppressed.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a base substrate;
an electronic component accommodated in a cavity formed in the base substrate;
a resin insulating layer formed on the base substrate such that the resin insulating layer is covering the electronic component;
a conductor layer formed on the resin insulating layer; and
a plurality of via conductors formed in the resin insulating layer and each comprising a seed layer and an electrolytic plating layer formed on the seed layer such that the via conductors are connecting the conductor layer and a plurality of electrodes of the electronic component,
wherein the resin insulating layer includes resin and inorganic particles comprising at least one of silica and alumina and has a plurality of via holes in which the plurality of via conductors is formed respectively such that the inorganic particles include first inorganic particles having smooth surfaces and second inorganic particles embedded in the resin insulating layer and that an inner wall surface of each of the via holes includes the resin and the smooth surfaces of the first inorganic particles, and the plurality of via conductors is formed such that the seed layer is a sputtering film comprising a first layer formed in contact with the inner wall surface of each of the via holes and a second layer formed on the first layer, that the first layer comprises a copper alloy comprising copper, silicon and aluminum and that second layer comprises copper.

2. The printed wiring board according to claim 1, wherein the resin insulating layer is formed such that the smooth surfaces are cut surfaces of the inorganic particles.

3. The printed wiring board according to claim 1, wherein the resin insulating layer is formed such that a surface of the resin and the smooth surfaces in the via holes are flush with each other.

4. The printed wiring board according to claim 1, wherein the resin insulating layer is formed such that the conductor layer is formed on a surface of the resin insulating layer and that the surface of the resin insulating layer is formed only of the resin.

5. The printed wiring board according to claim 1, further comprising:
a first conductor layer formed on the base substrate such that the resin insulating layer is covering the first conductor layer and the electronic component.

6. The printed wiring board according to claim 5, wherein the resin insulating layer is formed such that the smooth surfaces are cut surfaces of the inorganic particles.

7. The printed wiring board according to claim 5, wherein the resin insulating layer is formed such that a surface of the resin and the smooth surfaces in the via holes are flush with each other.

8. The printed wiring board according to claim 5, wherein the resin insulating layer is formed such that the conductor layer is formed on a surface of the resin insulating layer and that the surface of the resin insulating layer is formed only of the resin.

9. The printed wiring board according to claim 1, wherein the resin insulating layer is formed such that the smooth surfaces of the first inorganic particles have an arithmetic mean roughness Ra of 1.0 μm or less.

10. The printed wiring board according to claim 4, wherein the resin insulating layer is formed such that the surface of the resin insulating layer has an arithmetic mean roughness Ra in a range of 0.02 μm to 0.06 μm.

11. The printed wiring board according to claim 4, wherein the resin insulating layer is formed such that the smooth surfaces of the first inorganic particles have an arithmetic mean roughness Ra of 1.0 μm or less and that the surface of the resin insulating layer has an arithmetic mean roughness Ra in a range of 0.02 μm to 0.06 μm.

12. The printed wiring board according to claim 5, wherein the resin insulating layer is formed such that the smooth surfaces of the first inorganic particles have an arithmetic mean roughness Ra of 1.0 μm or less.

13. The printed wiring board according to claim 8, wherein the resin insulating layer is formed such that the surface of the resin insulating layer has an arithmetic mean roughness Ra in a range of 0.02 μm to 0.06 μm.

14. The printed wiring board according to claim 8, wherein the resin insulating layer is formed such that the smooth surfaces of the first inorganic particles have an arithmetic mean roughness Ra of 1.0 μm or less and that the surface of the resin insulating layer has an arithmetic mean roughness Ra in a range of 0.02 μm to 0.06 μm.

15. The printed wiring board according to claim 1, wherein the inorganic particles of the resin insulating layer includes one of silica and alumina.

16. The printed wiring board according to claim 15, further comprising:

a first conductor layer formed on the base substrate such that the resin insulating layer is covering the first conductor layer and the electronic component.

17. The printed wiring board according to claim 15, where the resin insulating layer is formed such that the smooth surfaces of the first inorganic particles have an arithmetic mean roughness Ra of 1.0 μm or less.

18. The printed wiring board according to claim 15, wherein the resin insulating layer is formed such that the surface of the resin insulating layer has an arithmetic mean roughness Ra in a range of 0.02 μm to 0.06 μm.

19. The printed wiring board according to claim 15, wherein the resin insulating layer is formed such that the smooth surfaces of the first inorganic particles have an arithmetic mean roughness Ra of 1.0 μm or less and that the surface of the resin insulating layer has an arithmetic mean roughness Ra in a range of 0.02 μm to 0.06 μm.

20. The printed wiring board according to claim 15, wherein the resin insulating layer is formed such that the conductor layer is formed on a surface of the resin insulating layer and that the surface of the resin insulating layer is formed only of the resin.

* * * * *